US008982644B1

(12) United States Patent
Bar-Lev

(10) Patent No.: US 8,982,644 B1
(45) Date of Patent: Mar. 17, 2015

(54) METHOD AND APPARATUS FOR MEMORY CONTROL

(71) Applicant: Marvell Israel (M.I.S.L.) Ltd., Yokneam (IL)

(72) Inventor: Eldad Bar-Lev, Kiryat Tivon (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 101 days.

(21) Appl. No.: 13/771,709

(22) Filed: Feb. 20, 2013

Related U.S. Application Data

(60) Provisional application No. 61/602,957, filed on Feb. 24, 2012.

(51) Int. Cl.
*G11C 7/00* (2006.01)
*G11C 7/22* (2006.01)

(52) U.S. Cl.
CPC ... *G11C 7/22* (2013.01); *G11C 7/00* (2013.01)
USPC ................................ 365/189.02; 365/230.06

(58) Field of Classification Search
CPC .................................... G11C 7/10; G11C 8/08
USPC ....................................... 365/189.02, 230.06
See application file for complete search history.

(56) References Cited

U.S. PATENT DOCUMENTS

| | | | | |
|---|---|---|---|---|
| 8,019,921 | B2 * | 9/2011 | Patel | 710/52 |
| 8,225,063 | B2 * | 7/2012 | Sita | 711/167 |
| 8,332,680 | B2 * | 12/2012 | Best | 713/400 |
| 8,495,310 | B2 * | 7/2013 | Gregorius et al. | 711/151 |
| 8,531,909 | B2 * | 9/2013 | Kim | 365/233.12 |
| 8,713,277 | B2 * | 4/2014 | Lilly et al. | 711/167 |

* cited by examiner

*Primary Examiner* — Michael Tran

(57) ABSTRACT

Aspects of the disclosure provide an integrated circuit (IC) that includes a processing unit and a signal-terminal matching circuitry. The processing unit is configured to communicate with an external memory device through conductive couplings that electrically couple terminals of an IC external interface respectively with terminals of the external memory device. The external memory device is disposed on a circuit substrate separate from the IC. The signal-terminal matching circuitry is configured to match memory control signals to the terminals of the IC external interface based on the external memory device.

17 Claims, 5 Drawing Sheets

300

| | M1 | M2 | M3 |
|---|---|---|---|
| O0 | A0 | A1 | A2 |
| O1 | A1 | A0 | A1 |
| O2 | A2 | A2 | A0 |
| O3 | A3 | A3 | A3 |
| | ↑ P1 | ↑ P2 | ↑ P3 |

FIG. 3

METHOD AND APPARATUS FOR MEMORY CONTROL

INCORPORATION BY REFERENCE

This application claims the benefit of U.S. Provisional Application No. 61/602,957 entitled "Muxing of SDRAM Address Pins" filed on Feb. 24, 2012, the content of which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

As computers and computer memories operate ever faster, memory performance becomes increasingly more difficult to control. For example, memory setup and hold times, which were measured in the tens of nanoseconds a decade ago, are now measured in picoseconds. As a result, the relative positioning and layout of processors and memory chips has become more difficult to manage.

SUMMARY

Aspects of the disclosure provide an integrated circuit (IC) that includes a processing unit and a signal-terminal matching circuitry. The processing unit is configured to communicate with an external memory device through conductive couplings that electrically couple terminals of an IC external interface respectively with terminals of the external memory device. The external memory device is disposed on a circuit substrate separate from the IC. The signal-terminal matching circuitry is configured to match memory control signals to the terminals of the IC external interface based on the external memory device.

In an embodiment, the signal-terminal matching circuitry includes multiplexers respectively corresponding to the terminals of the IC external interface and a control circuitry. A multiplexer is configured to select, in response to a select signal, one of the memory control signals, and provide the selected memory control signal to the corresponding terminal of the IC external interface. The control circuitry is configured to provide the select signal to the multiplexer based on the external memory device.

According to an aspect of the disclosure, the signal-terminal matching circuitry is configured to match the memory control signals to the terminals of the IC external interface based on a terminal pattern of the external memory device. In an example, the signal-terminal matching circuitry includes a programmable register configured to store a value in association with the external memory device.

Aspects of the disclosure also provide a method. The method includes generating memory control signals by a processing unit of an integrated circuit for communicating with an external memory device through conductive couplings that electrically couple terminals of an IC external interface respectively with terminals of the external memory device, matching the memory control signals respectively to terminals of the IC external interface based on the external memory device and providing the memory control signals to the matched terminals of the IC external interface.

Aspects of the disclosure also provide a system. The system includes an integrated circuit (IC) having a processing unit configured to generate memory control signals for communicating with memory devices. Further, the system includes a memory device disposed on a circuit substrate separate from the IC, and conductive couplings configured to electrically couple terminals of an IC external interface respectively with terminals of the memory device. The IC includes a signal-terminal matching circuitry configured to match the memory control signals to the terminals of the IC external interface based on the memory device.

BRIEF DESCRIPTION OF THE DRAWINGS

Various embodiments of this disclosure that are proposed as examples will be described in detail with reference to the following figures, wherein like numerals reference like elements, and wherein:

FIG. 3 depicts different control signal-terminal patterns available to different memories according to an embodiment of the disclosure.

DETAILED DESCRIPTION OF EMBODIMENTS

The disclosed methods and systems below are described generally, as well as in terms of specific examples and/or specific embodiments. For instances where references are made to detailed examples and/or embodiments, it is noted that any of the underlying principles described are not to be limited to a single embodiment, but may be expanded for use with any of the other methods and systems described herein as will be understood by one of ordinary skill in the art unless otherwise stated specifically.

For the following disclosure the term "control line" is defined as any signal line communicating information and/or timing signals, e.g., address lines, row-address strobes (RAS), column address strobes (CAS), read/write enable signals, and so on. However, the term "control line" excludes data lines for communicating data, power lines for providing power supply, reference voltages for providing reference voltages, and ground lines for providing ground connections.

Figure 1:
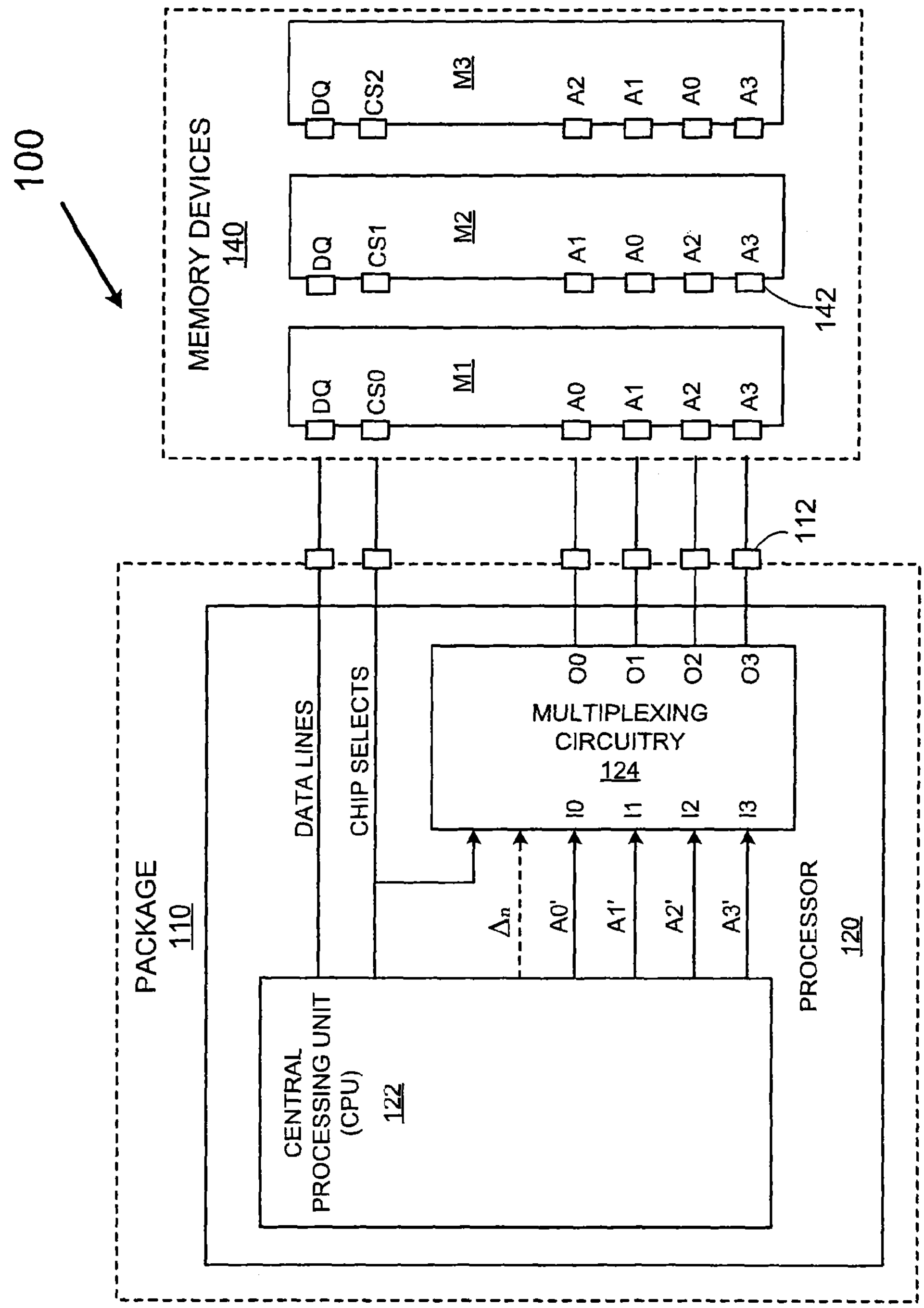
FIG. 1 shows a processing system 100 configured to provide versatile control signal connectivity according to an embodiment of the disclosure.

FIG. 1 shows a processing system 100 configured to provide versatile control signal connectivity by programmably changing the of various control signal-terminal patterns according to an embodiment of the disclosure. The processing system 100, in an embodiment, includes a processor 120 housed in a processor package 110, and one or more of memory devices 140. In an embodiment, the processor 120 is configured as a System on Chip (SoC). Although the memory devices 140 are depicted as being external to the package 110, in some embodiments, a memory device 140 is disposed on a die that is separate from the die containing the processor, and is housed within the same package as the processor.

The processor 120 includes a central processing unit (CPU) 122 and multiplexing circuitry 124. Electrical signals, such as data signals, address signals, chip select signals and so on are passed to the outside of package 110 via a series of first terminals 112. The first terminals 112 can be any suitable terminals, such as solder balls, solder bumps, metal pins, and the like.

The memory devices 140 can be any suitable memory device. In an example, the processor 120 is coupled to a set of memory devices M1, M2 and M3. For simplicity, each memory device M1, M2 and M3 is depicted as having only four address terminals for address signals {A0, A1, A2, A3}, a respective chip select terminal for chip select signals {CS0, CS1, CS2}, and a set of data terminals for data signals DQ. However, in various embodiments each memory device M1, M2 and M3 can accommodate any suitable number of address signals, data signals, address strobes, chip select signals and other signals as is needed or desirable.

In another example, the processor 120 is coupled to one of the memory devices M1, M2 and M3.

According to an embodiment of the disclosure, the memory devices M1, M2 and M3 may not have the same terminal patterns. In the FIG. 1 example, the memory devices M1, M2 and M3 have different control terminal patterns. For example, the address terminals of the memory devices M1, M2 and M3 are arranged of different sequences. It is noted that a portion of the terminal patterns for M1, M2 and M3 can be the same. For example, the terminal pattern for data signals can be the same.

In the FIG. 1 example, the signals to and from the memory devices M1, M2 and M3 are communicated from the first terminals 112 of the processor package 110 via a series of second terminals 142. For the purposes of this disclosure, each of the memory devices M1, M2 and M3 is a synchronous dynamic random access memory (SDRAM) of one or more generations, e.g., double data rate 3 (DDR3) or double data rate 4 (DDR4). However, in other embodiments other memory technologies are usable including static memories and emerging dynamic memories.

It is noted, in lieu of the following discussion, that the terminal pattern for the different memory devices M1, M2 and M3 may be identical or may be different even if housed in identical packaging. For example, a four-gigabyte DDR3 SDRAM with a by-8 data signal configuration can be housed in an identical package as a by-8 DDR4 SDRAM, but have a different address signal and/or strobe signal assigned to a particular terminal. Similarly, different SDRAM configurations (e.g., by-4, by-8, and by-16) can be housed in identical package formats but have different terminal assignments. For the embodiment depicted in FIG. 1, the different memory devices M1, M2 and M3 have different address signal terminal patterns {A0, A1, A2, A3}, {A1, A0, A2, A3} and {A2, A1, A0, A3}.

According to an embodiment of the disclosure, for double data rate memory devices, generally, data signals are transmitted with a faster rate than control signals. Terminals of the memory devices assigned to data signals are generally arranged of a same terminal pattern to optimize routing of conductive couplings, such as copper lines and vias on a printed circuit board, between the memory device(s), and a memory controller, such as the processor 120, to enable fast data rate. In an example, when the terminals 112 assigned to data signals are of the same sequence to the terminals 142 assigned to the data signals, the printed circuit board can use less routing resources, such as shortened parallel copper lines, less metal layers, for coupling the processor 120 and the memory devices.

Terminals of the memory devices assigned to the controls signals, such as the address signals, enable signals, may not be arranged of the same terminal patterns. However, as memory speed is rising up, the control signals, such as the address signals, are becoming sensitive to timing as well.

According to an aspect of the disclosure, the processor 120 is configured to facilitate routing optimization of the conductive couplings on a printed circuit broad for coupling the terminals assigned to the control signals between the processor 120 and memory device(s) of different control terminal patterns.

In an embodiment, the processor 120 is configured to enable different types of memory devices to co-exist on a common printed circuit board (or other substrate) while minimizing routing issues so as minimize the number of board vias (through holes) and keep the physical lengths of wiring traces between different lines generally constant. Thus, in an embodiment the CPU (via control signal Δn) is configured to control multiplexers in the multiplexing circuitry 124 to pass a particular internal control signal (e.g., control signal A0', A1', A2,' or A3') to a respective electrical interface terminal 112. In order to adapt the output order/pattern of the control signals for different memories, the multiplexing circuitry 124 is configured as a signal-terminal matching circuit to match memory control signals to the interface terminals 112 based on the type of the memory device 140 to control. In an example, the multiplexing circuitry 124 is configured to change the output order/pattern of the terminals assigned to the address signals based on different address ranges and/or different chip select signals servicing different memory devices M1, M2 and M3.

Figure 2:
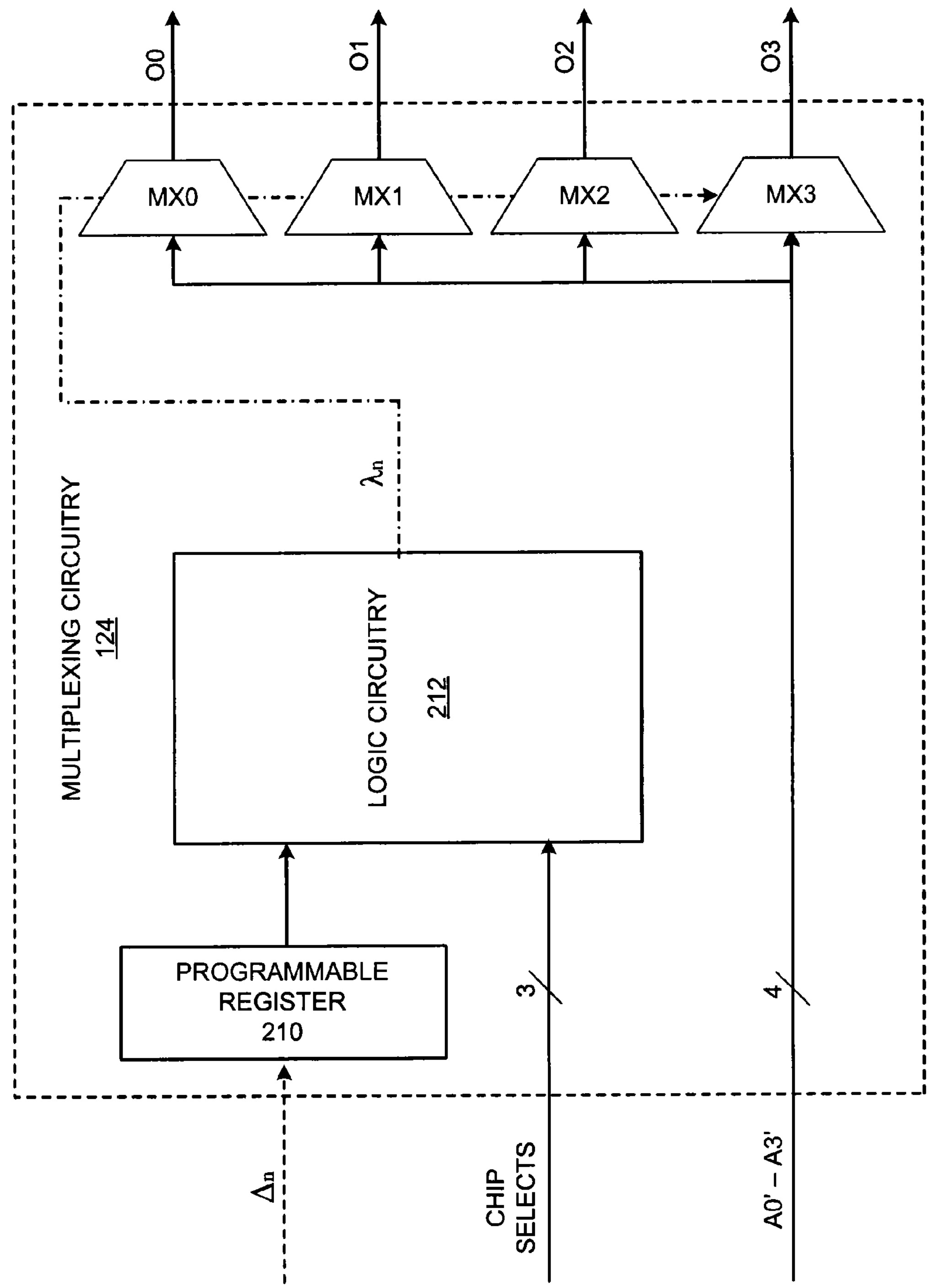
FIG. 2 depicts details of the multiplexing circuitry of FIG. 1 according to an embodiment of the disclosure.

FIG. 2 depicts details of an example of the multiplexing circuitry 124 of FIG. 1 according to an embodiment of the disclosure. The multiplexing circuitry 124 includes a programmable register 210, control (logic) circuitry 212 and four multiplexers {MX0, MX1, MX2 and MX3}.

In operation, in an example, the programmable register 210 receives a control signal Δn from an external source, such as the CPU 122 of FIG. 1 so as to configure the multiplexing operations in a manner different than an optional default setting. The programmable register 210, along with various chip selects (or alternatively a set of address lines capable of defining different address ranges) controls the operations of the control circuitry 212. In another example, the programmable register 210 is programmed by setting a switch on a printed circuit board. The switch is set based on the type of the memory device to be coupled with the processor 120.

The control circuitry causes each multiplexor {MX0, MX1, MX2, MX3} to pass a particular internal control signal {A0', A1', A2', A3'} to a respective electrical interface terminal via outputs {O0, O1, O2, O3}. The internal control signals are passed to particular terminals based on one or more address ranges defining memory space for different external memories. Accordingly, a first range of addresses will pass a first pattern of control lines to the interface terminals for memory device M1, a second range of addresses will pass a second pattern of control lines to the interface terminals for memory device M2, and so on noting that the first pattern can be different from the second pattern.

FIG. 3 is an example table 300 depicting different control signal-terminal switch patterns {P1, P2, P3} provided to four interface terminals by way of outputs {O0, O1, O2, O3} based on three different memory devices (M1, M2, M3). By adapting the different control signal-terminal patterns {P1, P2, P3} to the multiplexing circuitry 124 of FIGS. 1-2, the CPU 122 of FIG. 1 can transparently interface with different memory devices. In an example, the processor 120 uses the three memory devices M1, M2 and M3. The memory devices M1, M2 and M3 are served for three address ranges. Based on the address to access, the CPU 122 determines the chip select signal to select one of the memory devices M1, M2 and M3. Then, the chip select signal is used in the multiplexing circuitry 124 to select the control signal-terminal pattern that corresponds to the selected memory.

In another example, the processor 120 is coupled with one of the memory devices M1, M2 and M3 on a printed circuit board. The printed circuit board includes a programmable component, such as a switch, that can be programmed to indicate the type of memory device used on the printed circuit board. The programmable component provides the information of the type of memory device to the processor 120, and the information is used in the multiplexing circuitry 124 to select the control signal-terminal pattern that corresponds to the memory used on the printed circuit board.

In an embodiment, the application of different control signal-terminal patterns to a common set of interface terminals over different address ranges facilitates improved utilization of an electrical layout of electrical couplings on a circuit board between a processor package and memories, including a reduction (or elimination) in the number of vias on the circuit board between the processor package and the memories. In another embodiment, the processor and the memories are within a same package, the layout of the electrical couplings in the package is simplified by using the programmable control signal-terminal patterns.

Figure 4:
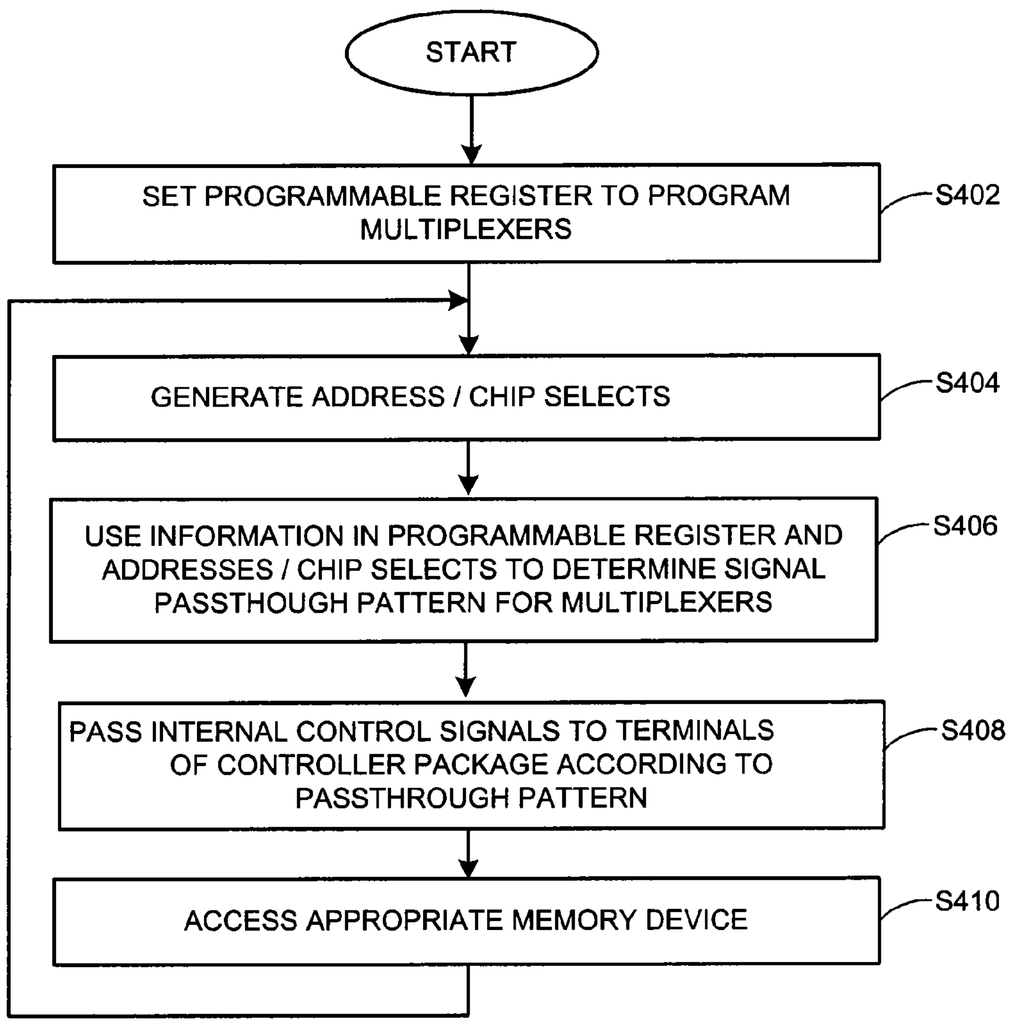
FIG. 4 is a flowchart outlining an operation of the disclosed methods and systems for multiplexing control signals to different memories according to an embodiment of the disclosure.

FIG. 4 is a flowchart outlining an operation of the disclosed methods and systems for multiplexing control signals to different memories. While the below-described operations are described as occurring in a particular sequence for convenience, it is noted that the order of the various operations may be changed from embodiment to embodiment. It is further noted that various operations may occur simultaneously or may be made to occur in an overlapping fashion.

Operation starts at S402 where a CPU or similar device sets a programmable register using some form of control signal, which in turn programs a set of multiplexers capable of providing different control signal-terminal patterns to a set of interface terminals based on a chip select signal and/or different address ranges. As mentioned above, the programmable register optionally has a default setting changeable by such programming. Next, at S404 the CPU generates address/chip selects in order to access an external memory. Then, at S406, using information from the programmable register and the address/chip selects, a particular control signal-terminal pattern (a passthrough pattern) corresponding to the external memory is selected to set the interface terminals corresponding to the terminal pattern of the external memory. Control continues to S408.

At S408, internal control signals are passed from the CPU to the external interface terminals according to the control signal-terminal pattern defined in S406. Then in S410, an appropriate memory device from a set of different memory device types is accessed by the CPU using the appropriately ordered control signals. Control then jumps back to S404.

Figure 5:
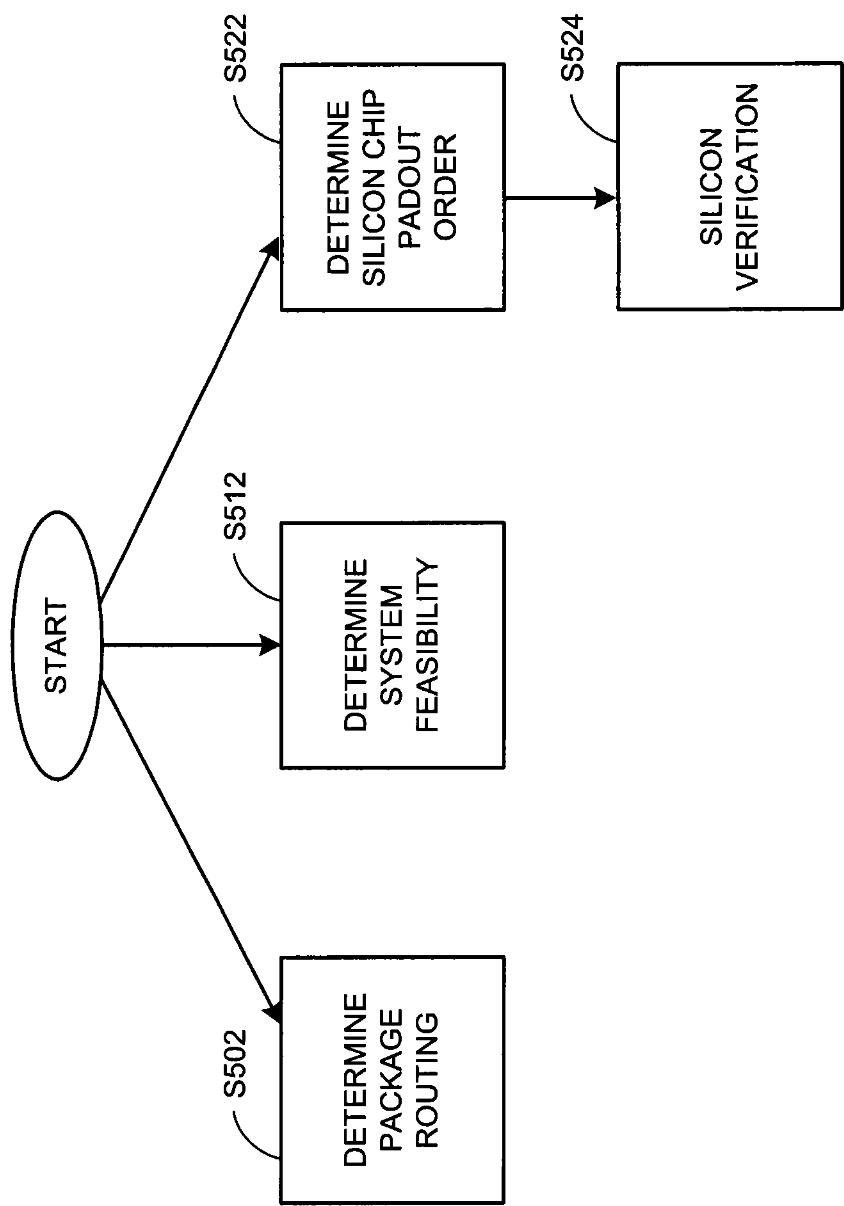
FIG. 5 is a flowchart outlining an operation of the disclosed methods and systems for developing processing system hardware having different memory types.

FIG. 5 is a flowchart outlining an operation of the disclosed methods and systems for developing processing system hardware configured to use different memory types, in accordance with an embodiment. The flowchart of FIG. 5 is differentiated from conventional development techniques in that use of the adaptive multiplexing scheme facilitates parallel development for processing systems requiring critical timing memory access to very high-speed memory devices, such as DDR3 and DDR4 SDRAMs, in an embodiment. That is, different teams devoted to package routing, system feasibility and silicon development can work in parallel and without interdependent steps causing multiple iterations every time a small change is made in a particular process. Accordingly, a method for designing a circuit board that is configured to accept any of a plurality of memories having different control pad configurations is provided whereby a processor is configured to selectably route different internal command signals to different electrical interface terminals of a package housing the processor.

The process includes performing in parallel at least two of: S502—determining package routing between the processor and the memories; S512—determining hardware system feasibility; and S522—determining a silicon pad-out order of the processor followed by S524.

According to an embodiment of the disclosure, because the control signal-terminal pattern is configurable in the processor, in an example, the package routing between the processor and the memories is determined based on an optimal terminal pattern that simplifies the package routing, such as with shorter length of copper wires, reduced number of vias, less metal layers, and the like. In an example, the package routing is implemented using parallel copper wires. Such implementation can use shorter wires, and improve system timing.

The techniques and devices described herein may be implemented by various means. In an example, the processing system 100 is implemented on a printed circuit board. In another example, the processing system 100 is implemented in a package. In an embodiment, the multiplexing circuit 124 is implemented using multiplexers. In another embodiment, the multiplexing circuit 124 is implemented as using switching circuits.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An integrated circuit (IC), comprising:

a processing unit configured to communicate with a plurality of external memory devices, the external memory devices being disposed on a circuit substrate separate from the IC, through conductive couplings that electrically couple terminals of an IC external interface respectively with different orders/patterns of address terminals of the external memory devices; and a signal-terminal matching circuitry configured to match different orders/patterns of memory control signals to the different orders/patterns of the address terminals of the external memory devices via the terminals of the IC external interface.

2. The IC of claim 1, wherein the signal-terminal matching circuitry further comprises:

multiplexers respectively corresponding to the terminals of the IC external interface, a multiplexer being configured to select, in response to a select signal, one of the memory control signals, and provide the selected memory control signal to the corresponding terminal of the IC external interface; and a control circuitry configured to provide the select signal to the multiplexer based on one of the external memory devices.

3. The IC of claim 1, wherein the memory control signals includes one or more of an address signal, an address strobe signal, and an enable signal.

4. The IC of claim 1, wherein the external memory devices are one of double data rate type three (DDR3) memory and double data rate type four (DDR4) memory.

5. The IC of claim 1, wherein the signal-terminal matching circuitry includes a programmable register configured to store a value in association with one of the external memory devices.

6. The IC of claim 1, wherein the terminals of the IC external interface are coupled to the address terminals of the external memory devices by the conductive couplings of a layout having at least one of a reduced number of metal layers and a shortened length of the conductive couplings.

7. A method, comprising:

generating different orders/patterns of memory control signals by a processing unit of an integrated circuit for communicating with a plurality of external memory devices, the external memory devices being disposed on a circuit substrate separate from the IC, through conductive couplings that electrically couple terminals of an IC external interface respectively with different orders/patterns of address terminals of the external memory devices;

matching the different orders/patterns of memory control signals respectively to the different orders/patterns of address terminals of the external memory devices via the terminals of the IC external interface; and providing the different orders/patterns of memory control signals to the matched different orders/patterns of address terminals of the external memory devices.

8. The method of claim 7, wherein matching the different orders/patterns of memory control signals respectively to the different orders/patterns of address terminals of the external memory devices via the terminals of the IC external interface further comprises:

generating a select signal based on one of the external memory devices; and multiplexing the memory control signals to a terminal of the IC external interface based on the select signal.

9. The method of claim 7, wherein generating the different orders/patterns of memory control signals by the processing unit of the integrated circuit for communicating with the external memory devices further comprises:

generating at least one or more of an address signal, an address strobe signal, and an enable signal.

10. The method of claim 7, wherein generating the different orders/patterns of memory control signals by the processing unit of the integrated circuit for communicating with the external memory devices further comprises:

generating the different orders/patterns of memory control signals by the processing unit of the integrated circuit for communicating with one of double data rate type three (DDR3) memory and double data rate type four (DDR4) memory.

11. The method of claim 7, wherein matching the different orders/patterns of memory control signals respectively to the different orders/patterns of address terminals of the external memory devices via the terminals of the IC external interface further comprises:

storing a value in association with one of the external memory devices;

matching a different order/pattern of memory control signals to a different order/pattern of address terminals of the one of the external memory devices via the terminals of the IC external interface based on the stored value.

12. A system, comprising:

an integrated circuit (IC) having a processing unit configured to generate different orders/patterns of memory control signals for communicating with a plurality of external memory devices;

the memory disposed on a circuit substrate separate from the IC;

conductive couplings configured to electrically couple terminals of an IC external interface respectively with different orders/patterns of address terminals of the external memory devices; and a signal-terminal matching circuitry configured to match the different orders/patterns of memory control signals to the different orders/patterns of address terminals of the external memory devices via the terminals of the IC external interface.

13. The system of claim 12, wherein the signal-terminal matching circuitry is a part of the IC.

14. The system of claim 12, wherein the signal-terminal matching circuitry further comprises:

multiplexers respectively corresponding to the terminals of the IC external interface, a multiplexer being configured to select, in response to a select signal, one of the memory control signals, and provide the selected memory control signal to the corresponding terminal of the IC external interface; and a control circuitry configured to provide the select signal to the multiplexer based on one of the external memory devices.

15. The system of claim 12, wherein the memory control signals includes one or more of an address signal, an address strobe signal, and an enable signal.

16. The system of claim 12, wherein the external memory devices are one of double data rate type three (DDR3) memory and double data rate type four (DDR4) memory.

17. The system of claim 12, wherein the signal-terminal matching circuitry includes a programmable register configured to store a value in association with one of the external memory devices.

* * * * *